United States Patent
Bergstrom et al.

(10) Patent No.: US 7,193,193 B2
(45) Date of Patent: Mar. 20, 2007

(54) MAGNETIC ANNEALING OF FERROMAGNETIC THIN FILMS USING INDUCTION HEATING

(75) Inventors: Paul L. Bergstrom, Houghton, MI (US); Melissa L. Trombley, Chassell, MI (US)

(73) Assignee: Board of Control of Michigan Technological University, Houghton, MI (US)

( * ) Notice: Subject to any disclaimer, the term of this patent is extended or adjusted under 35 U.S.C. 154(b) by 0 days.

(21) Appl. No.: 11/079,618

(22) Filed: Mar. 14, 2005

(65) Prior Publication Data

US 2005/0181126 A1 Aug. 18, 2005

(51) Int. Cl.
*H05B 6/10* (2006.01)

(52) U.S. Cl. .................................. 219/635; 219/647

(58) Field of Classification Search ............... 219/635, 219/697, 645, 618, 619; 118/724, 725, 50.1; 324/210, 228, 263

See application file for complete search history.

(56) References Cited

U.S. PATENT DOCUMENTS

| | | | |
|---|---|---|---|
| 2,393,541 A | 1/1946 | Kohler | |
| 4,007,369 A | 2/1977 | Dietze | |
| 4,945,397 A | 7/1990 | Schuetz | |
| 4,980,198 A | 12/1990 | Dowben et al. | |
| 4,983,804 A | 1/1991 | Chan et al. | |
| 5,225,005 A | 7/1993 | Burrage et al. | |
| 5,671,524 A | 9/1997 | Damsky et al. | |
| 6,096,149 A | 8/2000 | Hetrick et al. | |
| 6,217,672 B1 | 4/2001 | Zhang | |
| 6,288,376 B1 | 9/2001 | Tsumura | |
| 6,368,673 B1 | 4/2002 | Seo | |
| 6,455,815 B1 | 9/2002 | Melgaard et al. | |
| 6,465,281 B1 | 10/2002 | Xu et al. | |
| 6,509,621 B2 | 1/2003 | Nakao | |
| 6,518,588 B1 | 2/2003 | Parkin et al. | |
| 6,878,909 B2* | 4/2005 | Bergstrom et al. ......... 219/635 |
| 2001/0014268 A1 | 8/2001 | Bryson, III et al. | |
| 2001/0021570 A1 | 9/2001 | Cheng et al. | |
| 2002/0183721 A1 | 12/2002 | Santini, Jr. et al. | |
| 2003/0010775 A1 | 1/2003 | Kim | |
| 2005/0073300 A1* | 4/2005 | Matsukuma et al. ....... 324/210 |

FOREIGN PATENT DOCUMENTS

WO WO 01/20671 3/2001

OTHER PUBLICATIONS

George H. Brown, Cyril N. Hoyler, and Rudolph A. Bierwirth, Theory and Application of Radio-Frequency Heating, Sep. 1948, pp. 27-32, D. Van Nostrand Company, Inc., New York.

(Continued)

*Primary Examiner*—Quang Van
(74) *Attorney, Agent, or Firm*—Michael Best & Friedrich LLP

(57) ABSTRACT

A method of performing magnetic annealing of a ferromagnetic thin film applied to a substrate includes applying an oscillating magnetic field to the ferromagnetic thin film to induce a current therein and heat the ferromagnetic thin film. A directional magnetic field is applied to the ferromagnetic thin film at the same time as the ferromagnetic thin film is heated, and the ferromagnetic thin film is allowed to acquire a desired magnetic characteristic, and then the oscillating magnetic field is removed and the ferromagnetic thin film is allowed to cool.

20 Claims, 4 Drawing Sheets

OTHER PUBLICATIONS

Chester A. Tudbury, Basics of Induction Heating, vol. 1, May 1960, pp. 1-13 and 1-71.

Magnetic Susceptibility of the Elements and Inorganic Compounds, CRC Handbook of Chemistry and Physics, 80th Edition, 1999, pp. 4-131 to 4-136, CRC Press, Boca Raton, Florida.

Constantine A. Balanis, Advanced Engineering Electromagnetics, 1989, p. 55, John Wiley & Sons, New York.

Properties of Magnetic Materials, CRC Handbook of Chemistry and Physics, 80th Edition, 1999, pp. 12-117 to 12-125, CRC Press, Cleveland, Ohio.

Electrical Resistivity of Pure Metals, CRC Handbook of Chemistry and Physics, 80th Edition, 1999, pp. 12-45 to 12-47, CRC Press, Boca Raton, Florida.

S.M. SZE, Physics of Semiconductor Devices, Appendix H, Second Edition, 1981, pp. 850-851, John Wiley & Sons, New York.

Magnetic Materials: High-permeability Materials, CRC Handbook of Chemistry and Physics, 70th Edition, 1989, p. E-128, CRC Press, Boca Raton, Florida.

M.L. Trombley, P.L. Bergstrom, and B.P. Gogoi, Selective annealing of polysilicon microstructures by the inductive heating of thin cobalt films, Applied Physics Letters, pp. 1-3, Jan. 2003.

M.L. Trombley, B.P. Gogoi, and P.L. Bergstrom, Inductive Heated Thin Ferromagnetic Films for Localized Microstructural Annealing, XII International Materials Research Congress (2003) Program Abstracts, Aug. 17-21, 2003, p. 10-3, Cancun, Mexico.

Edward T. Zellers, K.D. Wise, K. Najafi, D. Aslam, R.B. Brown, Q.Y. Cai, J. Driscoll, M. Flynn, J. Giachino, R. Gordenker, M.D. Hsieh, C.T.C. Nguyen, P. Bergstrom, J. Drelich, C. Friedrich, E. Gamble, M. Kaviany, C.J. Lu, A. Matzger, M. Oborny, S. Pang, J. Potkay, R. Sacks, W.C. Tian, W. Steinecker, J. Whiting, Q. Zhong, Determinations of Complex Vapor Mixtures in Ambient Air with a Wireless Microanalytical System: Vision, Progress, and Homeland Security Applications, Engineering Research Center for Wireless Integrated MicroSystems, Nov. 13-14, 2002, pp. 92-95, Digest IEEE Conference on Technologies for Homeland Security, Waltham, MA.

Melissa Trombley, Paul Bergstrom Anand Kulkarni, Craig Friedrich, and Bishnu Gogoi, Post-CMOS Microsystem Integration through Inductive Annealing of Low-Temperature Materials, Engineering Research Center for Wireless Integrated MicroSystems, Associated Grants and Contracts, Project Description, May 2002.

Melissa L. Trombley and Paul L. Bergstrom, Microstructural Annealing using Inductively Heated Films, NSF, ERC for Wireless Integrated MicroSystems, Michigan Technological University, Department of Electrical and Computer Engineering, Houghton, MI, May 14, 2002.

K. Thompson, J.H. Booske, Y.B. Gianchandani, and R.F. Cooper, Electromagnetic Annealing for the 100 nm Technology Node, IEEE Electron Device Letters, Mar. 2002, pp. 127-129, vol. 23, No. 3, IEEE Electron Devices Society, New York.

Keith Thompson, Yogesh B. Gianchandani, John Booske, Reid F. Cooper, Direct Silicon-Silicon Bonding by Electromagnetic Induction Heating, Journal of Microelectromechanical Systems, Aug. 2002, pp. 285-292, vol. 11, No. 4, IEEE/ASME Publication.

Andrew Cao, Mu Chiao, and Liwei Lin, Selective and Localized Bonding Using Induction Heating, Technical Digest, Solid-State Sensor, Actuator and Microsystems Workshop, Jun. 2002, pp. 153-156.

Valery I. Rudnev, Raymond L. Cook, Don L. Loveless, and Micah R. Black, Induction Heat Treatment, Reprint of Chapters 11A and 11B of the Steel Heat Treatment Handbook, 1997, pp. 775-782 & pp. 794-802, Marcel Dekker.

Ross Spencer, Displacement Current, 1997, http://maxwell.byu.edu/~spencerr/websumm122/node72.html, Apr. 8, 1997.

Felicity Chipperfield, Induction Welding of Thermoplastics, Dec. 2000, http://www.twi.co.uk/j32k/protected/band_3/ksfc005.html, 2000.

V.A. Vas'ko, V.R. Inturi, S.C. Riemer, A. Morrone, D. Schouweiler, R.D.Knox, and M.T. Kief, High Saturation Magnetization Films of FEcOcR, Journal of Applied Physics, vol. 91, No. 10 dated May 15, 2002.

\* cited by examiner

| Inductive Heating Capabilities of Selected Materials ||||| 
|---|---|---|---|---|
| Material | Relative Permeability | Conductivity (S/μm) | Skin Depth at 1MHz | Power Density (W/m$^3$) |
| Aluminum | 1.0000165 | 41.4 | 78.2 μm | 6.21*10$^7$ |
| Copper | 0.99999454 | 64.8 | 62.5 μm | 4.96*10$^7$ |
| Germanium (n ~ 10$^{15}$ cm$^{-3}$) | 0.9999884 | 5*10$^{-5}$ | 71.2 mm | 4.90*10$^3$ |
| Germanium (n ~ 10$^{21}$ cm$^{-3}$) | 0.9999884 | 1 | 503 μm | 9.79*10$^7$ |
| Gold | 0.999972 | 48.8 | 72.0 μm | 5.72*10$^7$ |
| Molybdenum | 1.000072 | 20.6 | 111 μm | 8.80*10$^7$ |
| Palladium | 1.00054 | 10.2 | 158 μm | 1.25*10$^8$ |
| Platinum | 1.000193 | 10.4 | 156 μm | 1.24*10$^8$ |
| Silicon (n ~ 10$^{15}$ cm$^{-3}$) | 0.99999688 | 2.5*10$^{-5}$ | 101 mm | 2.45*10$^3$ |
| Silicon (n ~ 10$^{21}$ cm$^{-3}$) | 0.99999688 | 1 | 503 μm | 9.79*10$^7$ |
| Tantalum | 1.000154 | 8.20 | 176 μm | 1.40*10$^8$ |
| Titanium | 1.000151 | 2.56 | 315 μm | 2.50*10$^8$ |
| Tungsten | 1.000053 | 20.7 | 111 μm | 8.78*10$^7$ |
| Cobalt (99% pure) | 250 max | 17.9 | 7.52 μm | 1.49*10$^9$ |
| Iron (99% pure) | 6,000 max | 11.7 | 1.90 μm | 9.05*10$^9$ |
| Iron (99.9% pure) | 350,000 max | 11.7 | 0.249 μm | 6.91*10$^{10}$ |
| Nickel (99% pure) | 600 max | 16.2 | 5.10 μm | 2.43*10$^9$ |
| 78 Permalloy | 100,000 max | 6.3 | 0.634 μm | 5.03*10$^{10}$ |
| Supermalloy | 800,000 max | 1.7 | 0.432 μm | 2.74*10$^{11}$ |

MAGNETIC ANNEALING OF FERROMAGNETIC THIN FILMS USING INDUCTION HEATING

CROSS REFERENCE TO RELATED APPLICATIONS

This application claims priority under 35 U.S.C. § 120 to patent application Ser. No. 10/376,497, filed on Feb. 28, 2003, which application claims priority under 35 U.S.C. § 119 to provisional patent application No. 60/360,667, filed on Mar. 1, 2002. The entire contents of both applications are incorporated herein by reference.

BACKGROUND OF THE INVENTION

The present invention relates to induction heating, and magnetic annealing using induction heating.

Ferromagnetic thin films are important components of many microelectronic devices and structures. For example, magnetic random access memories (MRAMs) are magnetic storage devices that store information in the form of magnetization of a ferromagnetic thin film that comprises part of a magneto-resistive sensor. Information can been written into the ferromagnetic thin film and read out by detecting a magneto-resistance of the sensor. MRAMs have been refined to allow increasingly large amounts of data to be stored in a non-volatile manner and are typically fabricated on wafers using conventional semiconductor fabrication techniques.

The deposited ferromagnetic thin films in MRAMs and other devices and structures often require magnetic annealing in order to impart certain desired magnetic characteristics to such a layer. Specifically, magnetic annealing refers to a process by which a ferromagnetic material undergoes exposure to an external magnetic field at elevated temperatures in order to increase the size of magnetic domains to increase permeability and to impart a particular magnetic orientation to the magnetic dipoles in the ferromagnetic material. The crystalline structure of a deposited ferromagnetic thin film is responsive to increased temperature. In particular, raising the temperature increases the vibrational moments of atoms forming the crystalline structure, imparts a randomness to the motion of these atoms, and places these atoms in a state that provides minimal resistance to the influence of an external magnetic field. An external magnetic field causes the magnetic dipoles of these atoms to be oriented along the axis of the applied magnetic field. Prior art systems for performing magnetic annealing include a vacuum oven or furnace or the like for providing the elevated temperatures required.

Other modern microelectronic circuit process technologies incorporate device structures having high sensitivities to thermal treatment. The high sensitivities are due to the precise definition of device regions. These regions may include ultra-thin ion implanted source and drain regions in a submicron complementary metal-oxide-semiconductor field-effect transistor circuit (CMOS FET), among others, and exposure of such regions to high temperature result in the degradation of device performance. Thus, material and process related temperature limitations prohibit the integration or incorporation of a wide range of possible device structures in the fabrication process. Applications such as high temperature treatment of embedded high voltage, high current, or high power microelectronic devices often require complete thermal isolation of process modules. An example of such a system is an embedded processor that is responsible for driving motors. The system might include drivers for driving the motors, and a plurality of high density logic circuits for controlling the operation of the motor. Both the drivers and the logic circuits typically have different thermal capacities and, therefore, complicated processes are required to embed the drivers and the logic circuits in a single system.

The incorporation of devices into mainstream processing also presents thermal challenges for integration of the technologies. Device examples include micro-electromechanical systems (MEMS), micromachines and microsystems. Various thin film structures for the devices may also require thermal treatment to stabilize the mechanical properties for use. However, a microelectronic process typically requires lower temperatures throughout its processing. The relatively high thermal energy generated in the thermal treatment of the MEMS tends to impact the CMOS processing of the system. Similarly, embedding elements, like radio-frequency components into high density CMOS, require different thermal treatments and, thus, require complicated processes to embed them together.

Furthermore, many device packaging applications require protection or packaging, often prior to final encapsulation or before being singulated, in order for the devices to function. Pressure sensors, accelerometers, optoelectronic device assemblies, and some microelectronics technologies require packaging or assemblies that utilize temperatures above 300–400° C., which temperatures could damage microelectronic circuitry.

SUMMARY OF THE INVENTION

In one embodiment, the invention provides a method of performing magnetic annealing of a ferromagnetic thin film applied to a substrate. The method comprises applying an oscillating magnetic field to the ferromagnetic thin film to induce a current in the ferromagnetic thin film thereby heating the ferromagnetic thin film. A directional magnetic field is applied to the ferromagnetic thin film at the same time as the ferromagnetic thin film is heated. The ferromagnetic thin film is allowed to acquire a desired magnetic characteristic and then the energization of the coil is ceased and the ferromagnetic thin film is allowed to cool.

In another embodiment, the invention provides a method of performing magnetic annealing of a ferromagnetic thin film. The method includes applying a ferromagnetic thin film to a substrate and energizing a coil with an AC source at a predetermined frequency, power level and duration to generate a magnetic flux that induces a current in the ferromagnetic thin film thereby heating the ferromagnetic thin film. A magnetic field is applied to the ferromagnetic thin film at the same time as the ferromagnetic thin film is heated, thereby allowing the ferromagnetic thin film to acquire a desired magnetic characteristic.

In another embodiment, the invention provides a method of performing localized heating of a first thin film on a substrate. A ferromagnetic thin film is applied to the substrate. A first act of applying an oscillating magnetic field to the ferromagnetic thin film is performed to induce current in the ferromagnetic thin film thereby heating the ferromagnetic thin film. A magnetic field is applied to the ferromagnetic thin film at the same time that the ferromagnetic thin film is heated by the first act of applying an oscillating magnetic field, thereby magnetically annealing the ferromagnetic thin film. A second act of applying an oscillating magnetic field to the ferromagnetic thin film is performed to induce current in the ferromagnetic thin film thereby heating the ferromagnetic thin film and the first thin film to change a property of the first thin film.

Other features and advantages of the invention will become apparent by consideration of the detailed description and accompanying drawings.

BRIEF DESCRIPTION OF THE DRAWINGS

FIG. 4 is a table listing the inductive heating properties of selected microsystem materials and some common ferromagnetics.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. In addition, the terms "connected" and "coupled" and variations thereof are not restricted to physical or mechanical connections or couplings.

The following description relates to methods of and apparatus for performing regional heating of a substrate by induction heating. Induction heating can be utilized in industrial processes to modify the mechanical properties of materials. As an alternative to ambient heating, induction heating allows for localized temperature control of a specific region of a material, device, or substrate. Thus, not only does induction heating potentially conserve energy but it also allows protection of temperature-sensitive components. For these and other reasons, induction heating has several potential applications in microelectronic and microsystem fabrication. In one such application, induction heating is used in a magnetic annealing process, as further described below.

Inductive coupling to ferromagnetic films allows for the localized heating of selected areas. This potentially prevents significant heat energy from reaching the substrate and, thus, allows for substantially increased flexibility in microelectronic and microsystem design.

This description pertains to fabricating thin film structures and devices on a substrate, and to enclosing a product, such as an integrated microsystem, in a package. Package examples include monolithic packaging wafer scale packaging. In one embodiment, the product is fabricated on a flat silicon substrate. However, other substrate materials can also be used. For example, a substrate can be a semiconductor such as germanium or gallium arsenide, semimetals such as bismuth and molybdenum, metals and metal alloys such as copper and stainless steel, insulators such as silicon dioxide and aluminum oxide, organic polymers such as Teflon, and inorganic polymers such as silioxane. Various different substrate profiles can be used including, but not limited to, flat, curved, cylindrical, and spherical.

Figure 1:
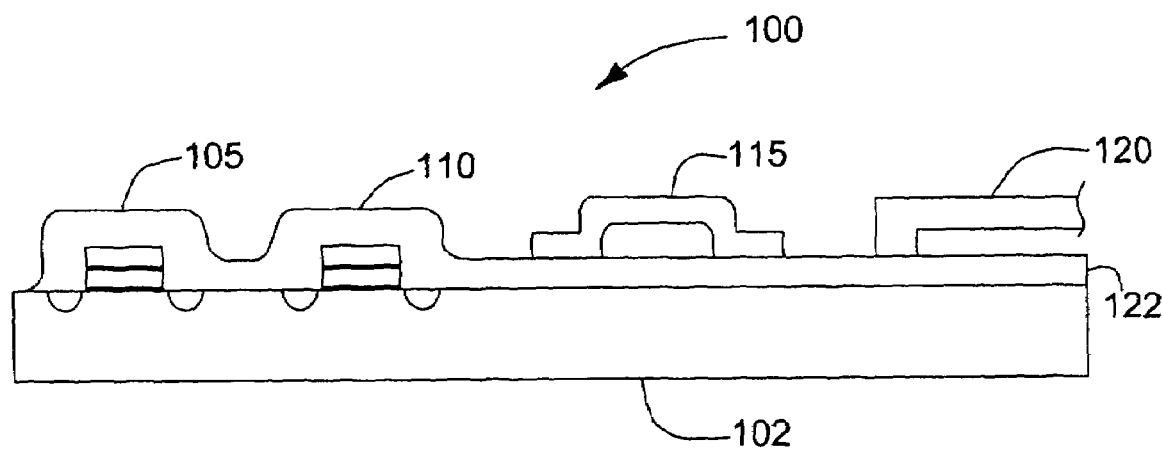
FIG. 1 is a sectional view of a system.

Induction heating is applicable to a variety of device classifications including, but not limited to, microelectronic devices, micro-electromechanical devices, and packaging and wafer bonding structures. FIG. 1 shows a sectional view of a system 100, such as a wafer, including a substrate 102, a plurality of devices 105 and 110, and a plurality of structures 115 and 120. A diffusion barrier 122 is deposited onto devices 105 and 110 as a passivation layer for the substrate 102. The first device 105 depicts an electronic device that does not require induction heating, the second device 110 depicts an electronic device that requires induction heating, the first mechanical structure 115 depicts a mechanical structure that requires heat treatment, and the second structure 120 depicts a mechanical structure intended for packaging or wafer bonding.

Figure 2:
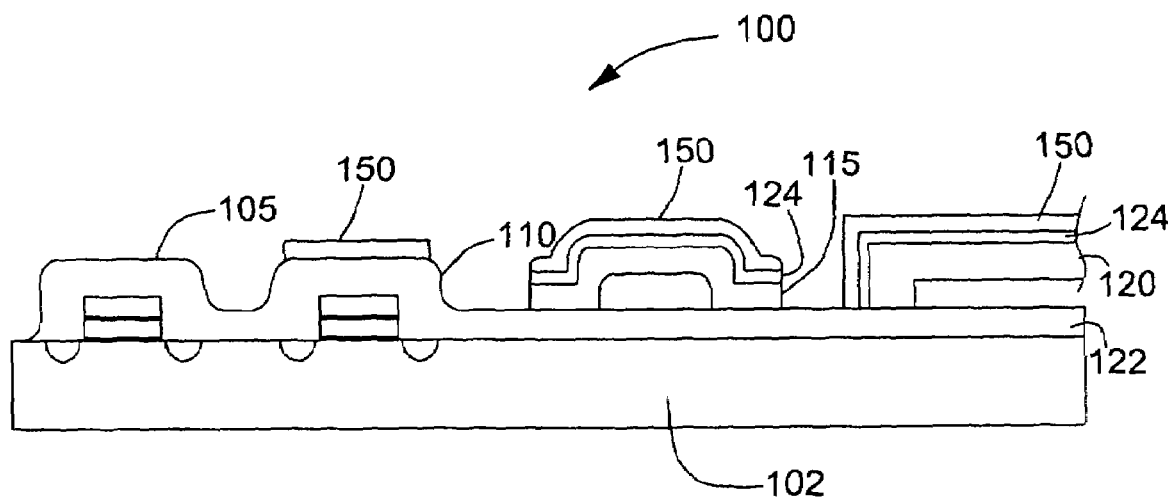
FIG. 2 is a sectional view of the system shown in FIG. 1 with an electrically conductive film.

FIG. 2 shows a sectional view of the system 100 shown in FIG. 1 with an electrically conductive film 150. The film 150 covers only the areas of the system 100 to be heated. In one embodiment, the film 150 is patterned through photolithography. However, patterning may also be achieved by other methods depending on the type of film applied and the deposition technique chosen. In some embodiments, a suitable barrier film material 124 including, but not limited to, silicon dioxide or silicon nitride isolates the film 150 from the structural and device layers 115, and 120.

In some applications, the system 100 can have more than one layer of conductive film. That is, the thickness of the film 150 can vary. Additionally, multiple, different film materials can be deposited on or applied to the system 100. Varying the thickness or varying the type of the film 150 allows for different temperature increments when energy is induced in the film 150.

In one embodiment, the deposition technique is sputtering. However, other techniques suitable for depositing the film 150 on or applying the film 150 to the system 100 are available. Other film application or depositing techniques include, but not limited to, thermal evaporation, liquid phase chemical technique, gas phase chemical process, glow discharge process, electronic beam ("EB") evaporation method, ion beam assisted deposition, chemical vapor deposition ("CVD"), plasma enhanced chemical vapor deposition ("PECVD"), pulsed laser ablation ("PLD"), chemical solution deposition, cathodic arc deposition, and a combination of different techniques or processes. In some embodiments, electroplating is used even though it may result in relatively thick film application or deposition. In one embodiment, the thickness ranges from a half micron up to ten microns thick. However, depending on the application, localized inductive heating still works with other thicknesses such as 50, 100, 200, 500, or higher number of microns.

Figure 3:
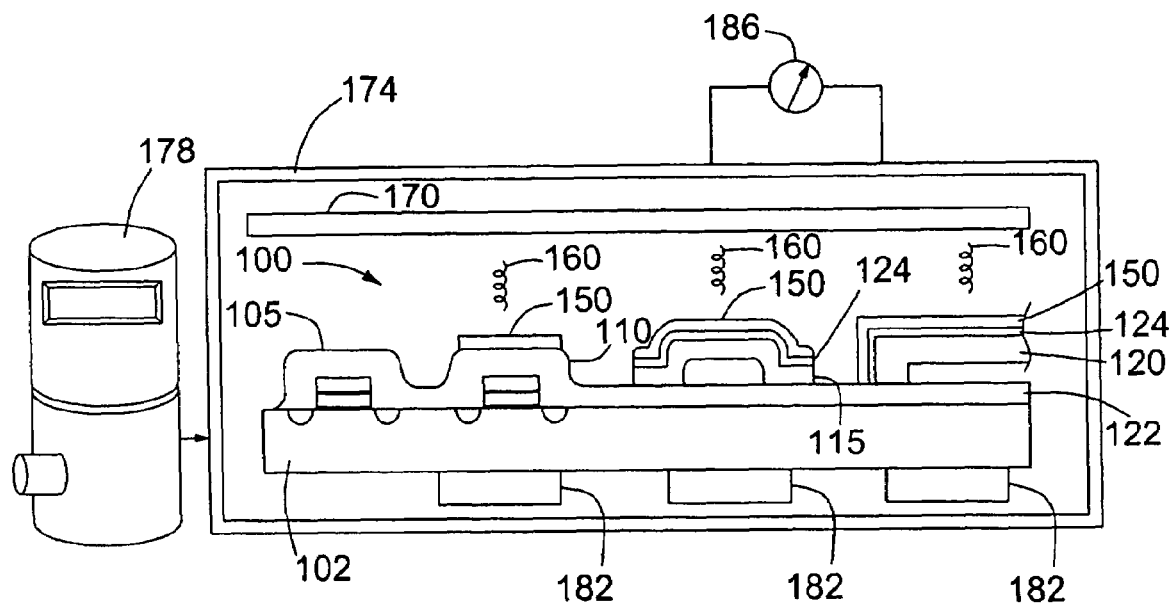
FIG. 3 is a sectional view of the system shown in FIG. 2 placed near an inductive coil.

Referring now to FIG. 3, the system 100 is placed near an inductive coil 170, whose structure, orientation, and distance from the wafer 100 are arranged so as to achieve a desired magnetic coupling effect (represented by 160). The system 100 and the coil 170 are then positioned in a substrate chamber 174 to control the induction environment. The magnitude, polarity, and overall behavior of the electric field induced in the material or materials through which the magnetic field passes define the magnetic coupling effect. In one embodiment, the system 100 is positioned such that the coil 170 extends above and below the substrate by approximately equal amounts so as to be exposed to a magnetic field which is fairly uniform and unidirectional. Specifically, the substrate 100 is positioned adjacent the coil 170 such that the nearest loops of the coil 170 are located at a distance of 0.25 cm from the top and bottom surfaces of the substrate 100. However, other configurations and distances are possible depending on the coil 170 and the substrate. A power source applies a time-varying electric field at a frequency and power setting to the inductive coil 170. This results in a current being generated within the film 150. The magnitude of the current is a product of the electric field strength and the material conductivity, σ. A magnetic field of the same frequency is obtained according to Ampere's law, which is given by $$\nabla \times H = J + \frac{\partial D}{\partial t} \quad (1)$$

where H denotes the magnetic field vector, J is the current passing through the coil 170, and D is the electric displacement current that arises due to the stretching of electron clouds in the external medium and is proportional to the electric field strength by the electric permittivity of the medium, ε. Placing the charged inductive coil 170 near the wafer 100 induces an electric field of the same initial frequency in the conductive film 150 according to Faraday's law, which is given by $$\nabla \times E = -\frac{\partial B}{\partial t} \quad (2)$$

where E denotes the secondary electric field vector and B is the magnetic flux. The magnetic flux, B, is proportional to the magnetic field strength by the magnetic permeability, μ, of the film 150. If the secondary material, such as the film 150, is an electric conductor, then the induced electric field gives rise to eddy currents throughout the region of magnetic field overlap. The result is the heating of the device 110, and the structures 150 and 120 through their $I^2R$ power loss. Equation (2) indicates that the direction of the alternating currents oppose that of the conduction current in the coil 170, J. Heating is also obtained as a result of hysteresis, which occurs as a result of a nonzero time required for the material to magnetize along a given direction. Hysteresis losses are typically less prevalent than eddy current losses and increase with frequency.

As for the conductive material used for the film 150, most substances that conduct an electric current are capable of being inductively heated. As indicated by Faraday's law, however, certain materials interact with magnetic fields more effectively than others. The magnetic permeability of a material is largely a function of its unpaired electrons. When electrons accumulate in the valence band of an atom or molecule, it is energetically favorable for them to assume states with the same spin direction until all such states are filled, at which point they begin to fill states of the opposite spin direction, forming spin-up and spin-down pairs. If one or more unpaired electrons remain, the material has an overall spin magnetic moment that is polarizable along any direction by applying a magnetic field. The magnitude of this moment determines the permeability of a material and its relative usefulness in inductive heating applications.

Substances classified as diamagnetic have no unpaired electrons and thus are only weakly polarizable, less so than free space. Paramagnetic materials have at least one unpaired electron per atom or molecule and thus a magnetic field results in a moderate degree of alignment. Perhaps the most versatile materials are the ferromagnetics, which can be polarized to varying degrees by adjusting the strength of the applied field and can often be made to polarize very strongly. Ferromagnetic materials typically hold their alignment for a long but finite amount of time after the field has been removed, and typically consist of the elements iron, nickel, and cobalt. Substances from any of these three classifications can be inductively heated, and combinations of materials from one or more groups can be used to achieve different degrees of heat generation. In one embodiment, a single film of ferromagnetic material including, but not limited to, a permalloy or other iron-containing ferromagnetic alloy is heated.

The electrical conductivity and magnetic permeability of a secondary material are also important in that they determine the frequency at which it can best be inductively heated as dictated by the electromagnetic skin effect. The eddy current density decreases from that induced at the outer edge of the material according to $$J_r = J_0 e^{-r/\delta} \quad (3)$$

where $J_r$ is the current density at a distance r from the surface, $J_0$ is the current density at the surface, and δ is the skin depth. The skin depth, δ, for a good electrical conductor is given approximately by $$\delta = \frac{1}{\sqrt{\pi \sigma \mu f}} \quad (4)$$

where σ is the electrical conductivity, μ is the magnetic permeability, and f is the chosen frequency for modulating the skin depth with respect to the dimensions along which the eddy currents propagate in order to achieve efficient inductive heating. Furthermore, assuming that the devices 115, 120 on the substrate 102 face out of the coil 170 such that the eddy currents propagates tangentially along a coil plane, the power dissipated, P, in a cylindrical-shaped object with radius a and thickness t is determined by the following piecewise expression:

$$P = \begin{cases} \frac{2\pi H_0^2 t}{\sigma} \left(\frac{a}{\delta}\right)^4, & a < 1.5\delta \\ \frac{8\pi H_0^2 t}{\sigma} \left(\frac{a}{\delta}\right), & a > 1.5\delta \end{cases} \quad (5)$$

where $H_0$ is assumed to be the uniform magnetic field measured in the free interior of the coil 170. Equations (4) and (5) show that inductive heating increases with frequency according to one of two schemes. The first scheme occurs at low frequencies where the power varies with $f^2$. The second scheme occurs at higher frequencies where it levels off to follow $f^{1/2}$. The process is optimized when the frequency is chosen such that the a/δ ratio is approximately four, with further increases in frequency producing relatively little benefit. The process can therefore be configured such that the targeted material or materials are in an optimal state while the non-targeted material or materials are not.

FIG. 4 gives a comparison of the inductive heating properties of some common ferromagnetics as well as several important materials in the fields of microelectronics and Microsystems in a table 400 using Equations (4) and (5). The spatial values chosen to represent the semiconducting materials were those of a standard four-inch substrate, where a=50 mm and t=0.5 mm. The values used for the metals correspond to the size of an inductively heated thin film patterned to cover a typical inertial sensing structure, a=0.5 mm and t=1 µm. The normalized power dissipation values show that the ferromagnetics are capable of converting magnetic energy to thermal energy far more efficiently than any of the microsystem materials. In general, the dimensions of the microsystem metals will be considerably smaller than the values used in this comparison, further decreasing their ability to absorb magnetic energy, and the ferromagnetics will exhibit additional heating due to hysteresis.

Depending on the nature of the heated object and the conditions under which it is heated, induction heating involves the heat transfer modes of conduction, convection, and radiation to varying degrees. In conduction, heat energy moves within the device 110 and the structures 115 and 120 from a region of high temperature to a region of low temperature. The rate at which the energy moves depends on a temperature gradient and is given by Fourier's law, written as $$q_{cond} = -\lambda * \nabla T \qquad (6)$$

where $q_{cond}$ is the conductive heat flux, $\lambda$ is the spacing thermal conductivity, and T is the temperature. A large temperature gradient can arise through the material cross section due to the skin effect as described, and thus a large thermal conductivity is desirable if the entire material is to be heated with a high degree of uniformity. The convective and radiative heat transfer modes both refer to energy dissipated at the surface of the device, and are a function of the difference between the surface temperature and the ambient temperature. Convection is the process by which heat energy escapes from an object to its surroundings and is described by Newton's law as $$q_{conv} = \alpha(T_S - T_A) \qquad (7)$$

where $q_{conv}$ is the convective heat flux, $\alpha$ is the surface heat transfer coefficient, $T_S$ is the surface temperature, and $T_A$ is the ambient temperature. This is typically an undesirable effect as it causes energy to be lost to the surroundings rather than applied to heating the material. As suggested by Newton's law, the rate of convective heat loss can be reduced by increasing the ambient temperature or by using an ambient gas that reduces the surface heat transfer coefficient. In one embodiment, the heating of the film occurs under vacuum so as to reduce the number of ambient molecules present to absorb heat energy.

In another potentially undesirable effect, radiative energy loss occurs when the temperature difference at the surface causes energy to escape in the form of electromagnetic waves. This is expressed by the Stefan-Boltzmann law as $$q_{rad} = k_B e_s (T_S^4 - T_A^4) \qquad (8)$$

where $q_{rad}$ is the radiative heat flux, $k_B$ is the Stefan-Boltzmann constant, $e_s$ is the surface emissivity, $T_S$ is the surface temperature, and $T_A$ is the ambient temperature. In one embodiment, the surface of the substrate 100 is polished prior to heating. This reduces the emissivity and, thus, reduces the energy loss by radiation.

The heat transfer process in a device can be modeled according to the Fourier equation $$C\gamma \frac{\partial T}{\partial t} + \nabla \cdot q_{cond} = Q \qquad (9)$$

where C is the specific heat of the material, $\gamma$ is the mass density, T is the temperature distribution, $q_{cond}$ is the conductive heat flux, and Q is the heat generation within the material. The solutions to the temperature distribution and the heat generation can be obtained by applying initial and boundary conditions. A common initial condition assumes that the initial temperature distribution is a constant equal to the ambient temperature. A boundary condition can be obtained using the conservation of energy principle at the surface of the device. One possible representation can be written as $$\lambda \frac{\partial T}{\partial n} + q_{conv} + q_{rad} + Q_S = 0 \qquad (10)$$

where $\lambda$ is the thermal conductivity of the material, T is the temperature distribution, n is a direction normal to the surface, $q_{conv}$ is the convective heat flux, $q_{rad}$ is the radiative heat flux, and $Q_S$ summarizes any additional surface losses such as those incurred if the material is quenched. However, additional boundary conditions can be found based on geometrical symmetries. Using computerized numerical methods, solutions can be obtained for different materials of varying geometries. In microsystem applications, the model can require further refinement to account for phenomena typically disregarded on larger scales.

Restating the process, a time-varying current is passed through the inductive coil 170 at an appropriate frequency and power setting, as described above, for a necessary time duration. The magnetic flux produced by the coil 170 induces a current in the film 150, resulting in the generation of heat energy due to resistive and hysteresis losses as detailed earlier. The process of placing the system 100 near the inductive coil 170 can be repeated to achieve different application specific characteristics. Upon completion of the induction heating, the film 150 can be either removed or allowed to remain as part of the overall structure.

Many devices, such as certain gas-composition sensors, gas preconcentrators, gas separation columns for chromatography, precision voltage or current reference circuitry, thermopneumatic valve structures, and many others, require heat-generation capability during normal operation. The heat generation is often accomplished using current-generated dissipation by attaching wires to the devices.

Figure 5:
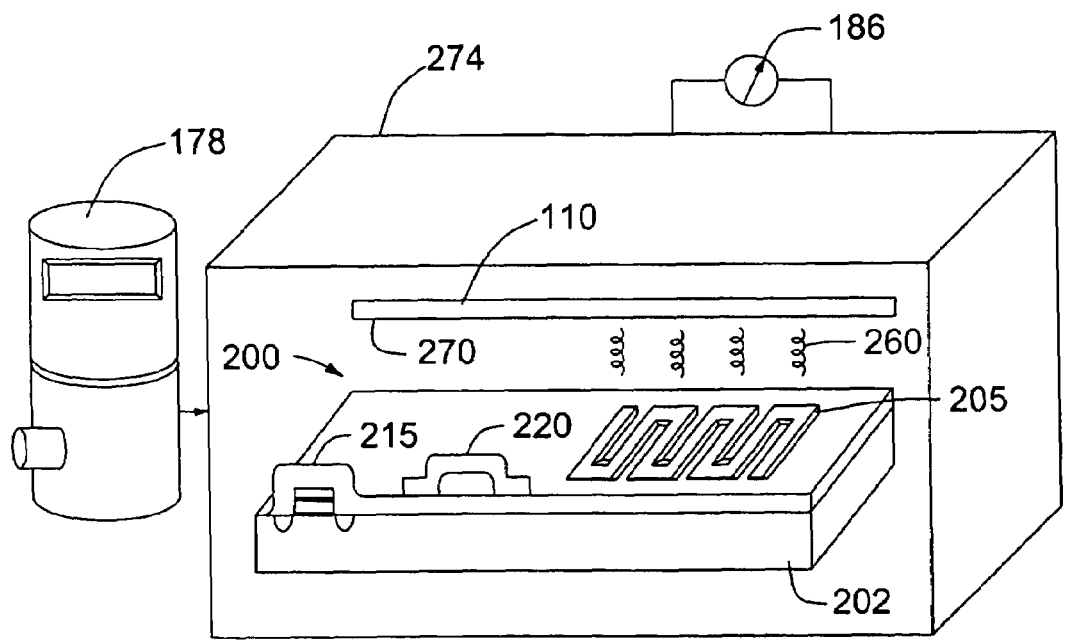
FIG. 5 is an isometric view of a second system containing a heating element.

FIG. 5 shows an isometric view of a second system 200 including a second substrate 202, a heating element 205, an electronic device 215, and a mechanical component 220. The second system 200 is further placed near a set of induction coils 270 positioned in a substrate chamber 274 to achieve a desired magnetic coupling effect represent by 260. This arrangement essentially eliminates the need for external leads and facilitates implementation in locations where physical connections are undesirable or difficult to obtain. The inductive coil 270 near the heating element 205 causes the element 205 to radiate thermal energy. Depending on the application, the element 205 can be located either on the surface of the device 200 or embedded under one or more layers.

One method for inductive heating a specific region on substrate will now be discussed. The acts discussed below can vary for other embodiments. To inductively heat thin films 150 deposited or applied and patterned on a silicon wafer or to locally heat selected regions of an integrated microsystem device on a substrate 102, materials are first preferably prepared. For example, the substrate 102 or the wafer is first prepared with a thin thermal oxide layer. The thin thermal oxide layer is generally used for structural support and substrate anchoring during the process. These optional layers of low-pressure chemical vapor deposition ("LPCVD") oxide have different thickness and are first deposited at a pre-selected temperature.

Depending on the design, devices 110 and structures 115, 120 are positioned on the substrate 102, or inside the substrate 102. Examples of devices and structures include single- and double-anchored cantilever beams, folded beams, Guckel rings, vernier strain gauges, sensors, gas preconcentrators, gas separation columns for chromatography, precision voltage or current reference circuitry, thermopneumatic valve structures and the like. Before the thin film 150 is deposited or applied, the devices 110 or structures 115, 120 with pre-selected thickness are first patterned. Specifically, the devices 110 and structure 115, 120 are patterned in a caustic or an alkaline solution such as potassium hydroxide using an oxide hardmask. Alternatively, other device 110 or structure 115, 120 patterning techniques such as sputter etching, reactive ion etching, ion beam etching, deep reactive ion etching, or other plasma or dry processing techniques may be used. The substrate 102 is then covered with a sputter-deposited oxide 124 with another pre-selected thickness to prevent them from coming into contact with the thin film 150.

Thereafter, an inductive thin film 150 is chosen. To choose an inductive thin film 150, the permeability and its corresponding Curie temperature, among other things, are considered. For example, cobalt can be used as an inductive thin film 150 because cobalt has a maximum permeability of approximately 250 times that of typical microsystem materials and its Curie temperature indicates efficient heating up to 1115° C., thereby allowing it to provide adequate thermal energy for grain regrowth in polysilicon. The thin film 150 is typically a ferromagnetic material that consists of, but not limited to, one or more of the elements such as iron, nickel, or cobalt.

In order to prevent the formation of diffused oxides on the substrate 102 due to the thin film 150, such as cobalt suicides, a diffusion barrier 124 (FIG. 2) or a plasma-enhanced chemical vapor deposition ("PECVD") oxide film is deposited over the entire substrate 102 or wafer. Thereafter, the chosen film 150 with the pre-selected thickness is evaporated or sputter-deposited onto a side of the substrate 102 using techniques such as shadow masking or sputtering with a thin film depositor 178 (FIG. 3). In the previous example, a 100 nm-thick cobalt film can be evaporated onto one side of the wafer using the shadow mask technique. Optional positioning of magnets near the substrate 102 to align the cobalt domains can be performed.

Heat reducers 182 around the targeted devices 110 or structures 115, 120 are then optionally and regionally provided to the substrate 102. Heat reducer examples include heat-sink, insulating layer, and thermal barrier layer. The substrate 102 is covered with the films 150 such that the heat generated in the targeted areas remains concentrated due to the thermal conductivity of the substrate 102.

The substrate 102, with the films 150, is then inductively heated in a substrate chamber 174 (e.g., a vacuum chamber). The substrate chamber 174 provides a low pressure ambient with minimal energy loss due to convection, among other things, thus stabilizing the annealing process and increasing the energy efficiency of the system. In operation, the substrate chamber 174 contains a controlled ambient gas. The ambient gas can be inert gas like nitrogen or argon for annealing. Other ambient gases include oxygen, forming gas (a mixture of nitrogen and hydrogen), and ammonia, or others. Depending on the deposition technique chosen, reactive gases can also be used. For example, the class of hydride gases such as silane, disilane, dichlorosilane, trichlorosilane, chlorosilane. The substrate chamber 174 can also be a vacuum chamber, such as a Norton NRC-3117 vacuum system, equipped with a mechanical vacuum pump and a vacuum diffusion pump. The mechanical pump, such as a Sargeant Welch model 1397 pump, is capable of a pressure of approximately $5 \times 10^{-4}$ Torr. The vacuum diffusion pump, such as a Norton type 0162 oil diffusion pump, is capable of an ultimate pressure of approximately $5 \times 10^{-8}$ Torr. The vacuum chamber can include a stainless steel baseplate with a plurality of feedthrough adapters that are configured to introduce electrical, fluidic, process gas, or mechanical manipulation mechanisms into the vacuum chamber.

Several coil configurations 170 can be used to apply the inductive heat. Example coil configurations include a solenoidal coil or a spinal coil. The coils 170 receive a varying current that fluxes at a frequency. An example frequency is 5 MHz. The solenoidal coil is generally chosen to subject the substrate 102 to a strong and relatively uniform magnetic field 160 with a dominant component in the z-direction. The substrate 102 is then positioned in the coils 170 such that the induced eddy currents are in the r-φ plane, generally eliminating the dependence of the required frequency on the film thickness.

The thermal annealing process is thus conducted at pressures below approximately 0.2 Torr, or any pressure that minimizes heat convection by the gas from the substrate 102. In one embodiment, high purity gas, such as nitrogen or argon, is continuously supplied into the chamber 174 using mass flow control, such as a Unit series 1200 mass flow controller. The annealing process then begins with controllably energizing the coil 170 by passing current from a current-voltage source 186 through the coil 170. Depending on the film 150, the size of the film 150, the volume of the film 150, the substrate 102, the size of the substrate 102, and the volume of the substrate 102 among other things selected, the energizing current can be short pulse, medium pulse, long pulse, short continuous or long continuous. The current is then applied to the coil 170 for a predetermined duration of time. Generally, short pulses leading to a one-second annealing process is sufficient. However, other durations can also be substituted. The energized coil 170 then results in a magnetic flux 160 at the coil 170 thereby inducing a current in the thin film 150. The induced currents then generate heat energy in the substrate 102 due to resistive and hysteresis losses. The process of placing the substrate 102 with the thin film 150 in the vacuum chamber to be near the coil 170 can be repeated to achieve different application specific characteristics. Optionally, the thin film 150 is then removed from the substrate 102 in an acidic solution such as sulfuric peroxide solution.

In yet another embodiment, a substrate 102, such as p-type silicon wafers, is placed in a furnace with oxygen ($O_2$) or water vapor ($H_2O$) ambient that oxidizes the substrate 102. This results in a thin layer of thermal silicon dioxide ($SiO_2$) to be grown on the substrate 102. Thereafter, structural anchors are put in place. For example, a patterned layer of thermal oxide that anchors the structures or devices can be deposited on the substrate 102.

For example, a hexa-methyl-disilane ("HDMS") or an adhesion primer and a layer of photoresist are spun on the substrate 102. The spinning can be performed on a spin station such as a Laurell Model WS-400-6NPP/LITE spinning station. In the embodiment, a Shipley S1813 photoresist is used. The substrate 102 is then softbaked at a preset temperature for a specific amount of time. For example, for a p-type silicon wafer, a Cole Parmer Dataplate digital hot plate softbakes the wafer at 90° C. for one minute. The photoresist is subsequently patterned using a mask such as the EV620 mask aligner, exposing the photoresist to ultraviolet ("UV") light. The UV light causes the exposed photoresist long polymer chains to break down into short chain polymers. Next, the photoresist is developed in a developer solution such as Shipley MF319. The developer dissolves away the broken down photoresist while leaving the unexposed photoresist intact. The areas where no photoresist is left is then etched using a buffered acid, such as a 5:1 buffered hydrofluoric ("BHF") acid.

A device 110 or structure 115 such as a polysilicon is then deposited to the substrate 102 at a predetermined temperature. For example, 2 microns of chemical vapor deposition ("CVD") polysilicon is deposited on the substrate 102 using Thermco TMX furnace at 625° C. Thereafter, oxide is again deposited or sputtered on the structure using a Perkin-Elmer 2400-8J RF sputtering system, for example. Similar to the oxide deposition procedure discussed, both HMDS and photoresist are spun on the substrate 102. The spun substrate 102 is then softbaked, masked, developed and etched. The polysilicon structure is finally etched in the areas where no oxide is present using another caustic (base) solution such as a 10:1 potassium hydroxide (KOH). Alternatively, other etching techniques may be used, such as sputter etching, reactive ion etching, deep reactive ion etching, ion beam etching, plasma etching, and other plasma or dry processing techniques.

After the device 110 or the structure 115 has been deposited on or in the substrate 102, a thin film depositor 178 (FIG. 3) deposits a barrier material 124, such as an oxide layer, that separates the polysilicon device 110 or structure 115, 120 from the thin film 150. For example, a Perkin-Elmer 2400-8J RF sputtering system can deposit a 0.25 micron layer of sputtered $SiO_2$ on the substrate 102. In some embodiment, the oxide layer is not patterned.

After the separating oxide layer has been deposited, a thin film 150 to be inductively heated is deposited or applied to the substrate 102. A ferromagnetic material, such as Cobalt, can be used as the thin film. The process of applying the thin film 150 is similar to the deposition of oxide to the substrate 102. Both HMDS and photoresist are first spun on the substrate 102 with the device 110 or structure 115 anchored. The substrate 102 is again softbaked, photoresist masked, and developed. Thereafter, the thin film 150 is applied, deposited or sputtered on the substrate 102. Subsequently, masked areas of the thin film 150 above the photoresist can be lifted using a solvent solution, such as acetone, with a Branson 3210 ultrasonic agitator leaving the thin film 150 on the substrate 102 only in the patterned regions.

The substrate 102 with the device 110 and the structure 115, 120 is then positioned in a substrate chamber 174, 274 and heated with a Lepel 7.5 kW system. The substrate 102 is typically mounted on thermally and electrically insulating contacts horizontally over the inductive coil 170 inside the substrate chamber 174. The mount can be a dielectric, such as fused quartz or silica, configured to incorporate a minimal contact to the substrate 102. Current is thereafter applied to the coil 170, which is positioned near (for example, surrounds or is adjacent to) the thin film. Once the current starts to energize the coil 170, the coil 170 generates an electromagnetic field having an electromagnetic flux as described earlier. The flux induces an eddy current in the thin film 150. Due to the resistive nature of the thin film 150, heat is generated in the thin film 150. Once the heat reaches a certain temperature, the substrate 102 is accordingly heated. As a result, the device 110 or the structure 115, 120 is thermally annealed or is bonded on or to the substrate 102.

In still another embodiment, the inductive heating of thin films on a substrate 102 involves the post-CMOS integrated processing of MEMS elements on the same wafer or substrate 102. A high density microelectronic device 105, a high density CMOS process for example, is first incorporated into a substrate 102. In some embodiments, the substrate 102 is a complete CMOS substrate.

Thereafter, appropriate electrical, mechanical, or optical passivations can be made to the substrate 102. For example, the substrate 102 can be passivated by a deposition technique such as sputtering or plasma-enhanced chemical vapor deposition ("PECVD"). Local interconnect for the post-CMOS device 110, 115, or 120 can be formed on the passivation layer or layers. For example, a spacer layer of sacrificial material is deposited and patterned for a sacrificial MEMS process. A MEMS structural layer 115, 120 can then be formed on top of the spacer. The spacer layer can be made from a low temperature doped silicon dioxide glass like phosphosilicate glass ("PSG") or borophosphosilicate glass ("BPSG").

Once the low temperature MEMS structural layer has been deposited onto the spacer, additional doping of suitable thickness to improve the electrical performance of the material is required in some embodiments. For example, in a lateral accelerometer structure, the layer thickness ranges from 3 μm to 30 μm. The structural layer is then patterned and etched to form the device geometry appropriate for the design. The structural layer 115, 120 can also be passivated for electrical and dopant isolation from any subsequent materials. A suitable electrical and diffusion barrier 124 such as a low temperature silicon nitride will passivate the structural layer.

An inductive coupling material 150 is thereafter deposited and patterned to form localized regions where the inductive coupling is maximized. In one embodiment, the thin film 150 thickness ranges from 0.3 μm to 5 μm. In some other embodiments, the thin film 150 is incorporated in the substrate 102. Heat reducers 182 are used in areas that are designed to remain cool relative to the MEMS structural material 115, 120. Additionally, the thin film 150 is removed in the areas that are designed to remain cool during the annealing process.

The substrate 102, with the devices 110 and the structures 115, 120 covered with thin films 150, is subsequently placed in or near an inductive coil 170 within a chamber 174, 274. In one embodiment, the chamber 174, 274 is a vacuum chamber. Once current is applied through the coil 170, the coil 170 induces magnetic coupling denoted by 160. The coupling further generates an eddy current in the thin film 150, which in turn generates heat in the substrate 102.

After a localized temperature is reached to affect the change in material properties desired for the MEMS material 115, 120, the substrate 102 is removed from the coil 170. In some embodiments, the inductive film 150 is removed from the substrate 102. Material property changes induced in the thin film 150 may include an increase in electrical conductivity due to enhanced diffusion of dopants into the film 150 and a reduction in the mechanical stress and stress gradients in the structural film 115. Furthermore, the passivation between 150 and 115 and 120 can also be removed. At this point, the structures 115 and 120 can be released using a typical surface micromachining sacrificial etch process, resulting in the completion of the mechanical annealing process.

In addition to the above-described method of controllably energizing a coil to generate a magnetic flux that induces current in the ferromagnetic thin film to heat it, other ways exist to apply an oscillating magnetic field to the ferromagnetic thin film to induce current therein and heat the ferromagnetic thin film. For example, a resonant cavity can be used, wherein the resonant cavity is a closed rectangular, cylindrical, or spherical metal box that acts as a waveguide and into which an electromagnetic field is introduced in some manner. A substrate can be positioned in the resonant cavity such that an oscillating magnetic field is transverse to the surface of the substrate. For example, a short probe wire or loop energized from a suitable frequency source and protruding into the cavity can be used to introduce an electromagnetic field. In one embodiment, a cylindrical cavity having a radius on the order of tens of centimeters can be used, wherein a substrate including a ferromagnetic thin film can be located at one end of the cylindrical cavity and parallel thereto. A microwave frequency source or higher wavelength source can be used as the source of the electromagnetic field and an oscillating magnetic field can be generated that has a desired orientation with respect to the ferromagnetic thin film such that currents are induced in the ferromagnetic thin film and heat is generated.

Figure 6:
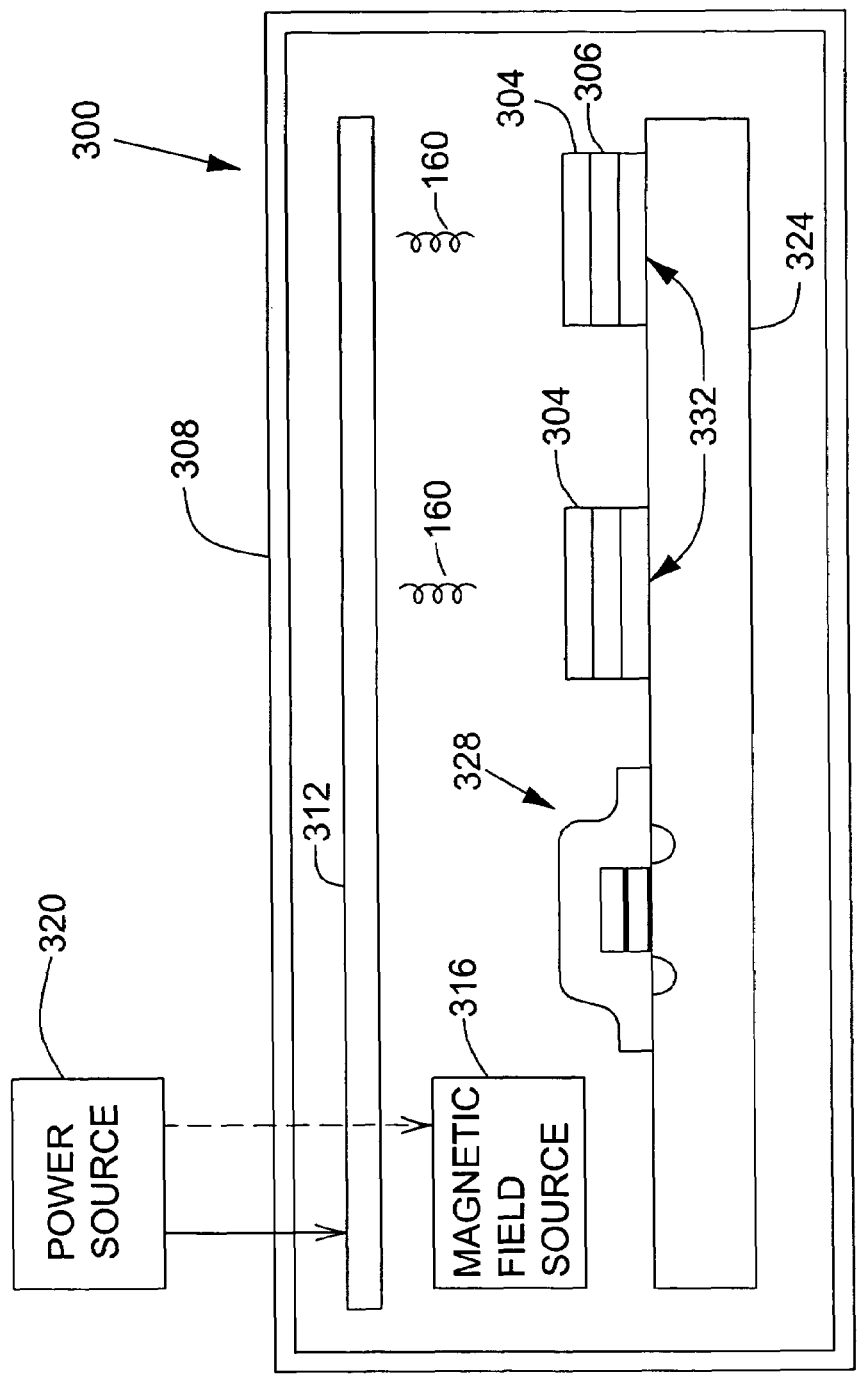
FIG. 6 is a sectional view of a system for performing magnetic annealing.

In another application, the induction heating of a ferromagnetic thin film itself is useful to generate the heat required for the magnetic annealing of that ferromagnetic thin film. For example, with reference to FIG. 6, a system 300 is illustrated for performing magnetic annealing of a ferromagnetic thin film 304. In particular, system 300 includes a substrate chamber 308, a coil 312, a magnetic field source 316, and a power source 320.

As previously described, the substrate chamber 308 can provide a vacuum ambient, a low pressure ambient, or can contain a controlled ambient gas. Further, a substrate 324 can be placed in the substrate chamber 308. In the illustrated embodiment, the substrate 324 includes a plurality of devices 328 and structures 332 that can include various layers that can be fabricated using the techniques previously described as well as others. In particular, one or more devices 328 or structures 332 can include a ferromagnetic thin film 304. Further, one or more devices or structures can include a first thin film layer 306.

In one embodiment of a method for magnetic annealing, a vacuum ambient is provided in the substrate chamber 308 to reduce the amount of oxidation of the ferromagnetic thin film 304 during the magnetic annealing process.

In order to perform magnetic annealing of the ferromagnetic thin film 304, an oscillating magnetic field is applied to the ferromagnetic thin film to induce current in the ferromagnetic thin film to heat it.

In one embodiment, a magnetic flux 160 is applied to the ferromagnetic thin film 304. For example, the coil 312 is positioned near the ferromagnetic thin film 304 and is controllably energized such that a magnetic flux 160 results and the magnetic flux 160 induces a current in the ferromagnetic thin film 304 thereby heating the ferromagnetic thin film 304. As discussed above, coil 312 is selected to have a structure, orientation, and distance from the substrate 324 so as to achieve a desired magnetic coupling effect, represented by 160. For example, coil 312 can be energized by passing a time-varying current through the coil 312 at an appropriate frequency, power setting, and duration. The coil 312 can also be pulsed. The power source 320 provides the electric power to the coil 312. The magnetic flux 160 produced by the coil 312 induces a current in the film 304, resulting in the generation of heat energy in the thin film 304, as described above.

In another embodiment, an oscillating magnetic field is applied to the ferromagnetic thin film using a resonant cavity and a microwave or higher wavelength frequency source.

At the same time as the ferromagnetic thin film 304 is heated, a directional magnetic field is applied to the ferromagnetic thin film 304 by the magnetic field source 316. The strength of the magnetic field required will depend on the type and thickness of the thin film 304 and a desired magnetic characteristic of the annealed film 304. Typical values for the applied magnetic field strength may be in the range of 60 to 1000 Oerstads. The magnetic field source 316 need not be located in the substrate chamber 308. In one embodiment, the source 316 is a permanent magnet. In another embodiment, the source 316 is an electromagnet, which can generate a directional magnetic field with an applied electric DC excitation from the power source 320.

Heating the ferromagnetic thin film 304 at the same time that a directional magnetic field is applied thus results in a desired magnetic characteristic of the ferromagnetic thin film 304. For example, magnetic domains in the ferromagnetic thin film are restructured. Specifically, the size of the magnetic domains is increased, resulting in an increase in the magnetic permeability of the ferromagnetic thin film. Simultaneously, a desired orientation of the magnetic dipoles in the ferromagnetic thin film 304 is established, with an easy magnetic axis that is aligned with the direction of the applied directional magnetic field.

Once a desired magnetic characteristic is achieved, the method further includes removing the oscillating magnetic field and allowing the ferromagnetic thin film 304 to cool. In one embodiment, this is achieved by ceasing the AC energization of the coil 312.

If a desired easy axis of the ferromagnetic thin film 304 corresponds to a direction that the ferromagnetic thin film 304 is easily heated, it may be possible for the source 316 to be an electromagnet that includes a coil that can be excited with a time varying power source. In other words, a single electromagnet can be excited by a DC source and an AC source such that the same coil provides the directional magnetic field and the oscillating magnetic field and magnetic flux 160.

The enhanced permeability of a ferromagnetic thin film that can result from a magnetic annealing process can make that ferromagnetic thin film more efficient in a subsequent induction heating process. For example, magnetic annealing is useful in one method of performing localized heating of a first thin film on a substrate to increase the efficiency of a ferromagnetic thin film 304. In particular, a first act of applying an oscillating magnetic field to the ferromagnetic thin film to induce a current therein to heat the ferromagnetic thin film is performed. In one embodiment, the first act includes controllably energizing a coil 312 positioned near the ferromagnetic thin film, wherein the first energizing act results in a magnetic flux 160 that induces current in the ferromagnetic thin film 304 thereby heating the ferromagnetic thin film 304.

A directional magnetic field is applied to the ferromagnetic thin film 304 at the same time that the ferromagnetic thin film 304 is heated by the first act of applying an oscillating magnetic field, thereby magnetically annealing the ferromagnetic thin film 304.

A second act of applying an oscillating magnetic field to the ferromagnetic thin film to induce a current therein to heat the ferromagnetic thin film is performed. In one embodiment, the second act includes controllably energizing a coil 312 positioned near the ferromagnetic thin film, wherein energizing the coil results in a magnetic flux that induces current in the ferromagnetic thin film 304 thereby heating the ferromagnetic thin film and the first thin film 306 to change a property of the first thin film 306, such as described above.

In such a method, the amount of heat produced to magnetically anneal the thin film 304 is less than amount of heat produced by the second act of applying an oscillating magnetic field to the ferromagnetic thin film. The first act results in an improved permeability of the thin film 304 as compared to the un-annealed ferromagnetic thin film. An increase in permeability means that subsequently heating the first thin film can be performed more efficiently and will require less power.

Upon completion of the second act of induction heating, the film 150 can be either removed or allowed to remain as part of the overall structure.

A magnetic annealing process as described above is advantageous in that no oven or furnace is required with attendant ramp up and down times and energy requirements. Further, an oven or furnace does not have the ability to selectively heat localized regions on or in the substrate. A magnetic annealing process using induction heating thus saves time and energy and provides the ability to selectively heat localized regions only.

Various other features and advantages of the invention are set forth in the following claims.

What is claimed is:

1. A method of performing magnetic annealing of a ferromagnetic thin film applied to a substrate, the method comprising:
    applying an oscillating magnetic field to the ferromagnetic thin film to induce a current in the ferromagnetic thin film thereby heating the ferromagnetic thin film;
    applying a directional magnetic field to the ferromagnetic thin film at the same time as the ferromagnetic thin film is heated;
    allowing the ferromagnetic thin film to acquire a desired magnetic characteristic and then removing the oscillating magnetic field and allowing the ferromagnetic thin film to cool; and
    wherein the substrate is positioned in a vacuum chamber during the acts of applying an oscillating magnetic field and applying a directional magnetic field.

2. A method of performing magnetic annealing of a ferromagnetic thin film applied to a substrate, the method comprising:
    applying an oscillating magnetic field to the ferromagnetic thin film to induce a current in the ferromagnetic thin film thereby heating the ferromagnetic thin film;
    applying a directional magnetic field to the ferromagnetic thin film at the same time as the ferromagnetic thin film is heated;
    allowing the ferromagnetic thin film to acquire a desired magnetic characteristic and then removing the oscillating magnetic field and allowing the ferromagnetic thin film to cool; and
    wherein the act of applying an oscillating magnetic field includes controllably energizing a coil positioned near the ferromagnetic thin film to generate a magnetic flux that induces a current in the ferromagnetic thin film.

3. The method of claim 2, wherein energizing a coil comprises pulsing a current through the coil.

4. The method of claim 2, wherein energizing a coil comprises controlling the frequency and power of a current provided to the coil.

5. The method of claim 2, wherein the acts of energizing a coil and applying a directional magnetic field are both performed using a single electromagnet.

6. A method of performing magnetic annealing of a ferromagnetic thin film applied to a substrate, the method comprising:
    applying an oscillating magnetic field to the ferromagnetic thin film to induce a current in the ferromagnetic thin film thereby heating the ferromagnetic thin film;
    applying a directional magnetic field to the ferromagnetic thin film at the same time as the ferromagnetic thin film is heated;
    allowing the ferromagnetic thin film to acquire a desired magnetic characteristic and then removing the oscillating magnetic field and allowing the ferromagnetic thin film to cool; and
    wherein the act of applying an oscillating magnetic field includes using a resonant cavity.

7. A method of performing magnetic annealing of a ferromagnetic thin film, the method comprising:
    applying a ferromagnetic thin film to a substrate;
    energizing a coil with an AC source at a predetermined frequency, power level and duration to generate a magnetic flux that induces a current in the ferromagnetic thin film thereby heating the ferromagnetic thin film; and
    applying a directional magnetic field to the ferromagnetic thin film at the same time as the ferromagnetic thin film is heated, thereby allowing the ferromagnetic thin film to acquire a desired magnetic characteristic.

8. The method of claim 7, further comprising positioning the substrate in a vacuum chamber prior to the act of energizing a coil.

9. The method of claim 7, wherein the act of applying a directional magnetic field is accomplished by energizing a coil with a DC source.

10. The method of claim 9, wherein the same coil is used for both acts of energizing a coil.

11. The method of claim 7, wherein the magnetic field is applied using one of a permanent magnet and an electromagnet.

12. A method of performing localized heating of a first thin film on a substrate, the method comprising:
    applying a ferromagnetic thin film to the substrate;
    performing a first act of applying an oscillating magnetic field to the ferromagnetic thin film, the first act inducing current in the ferromagnetic thin film thereby heating the ferromagnetic thin film;
    applying a directional magnetic field to the ferromagnetic thin film at the same time that the ferromagnetic thin film is heated by the first act of applying an oscillating magnetic field, thereby magnetically annealing the ferromagnetic thin film; and performing a second act of applying an oscillating magnetic field to the ferromagnetic thin film, the second energizing act inducing current in the ferromagnetic thin film thereby heating the ferromagnetic thin film and the first thin film to change a property of the first thin film.

13. The method of claim 12, further comprising positioning the substrate in a vacuum chamber prior to the first act of applying an oscillating magnetic field.

14. The method of claim 12, wherein the ferromagnetic thin film is patterned to selectively control which areas on the substrate are heated.

15. The method of claim 12, wherein the first thin film does not combine with the ferromagnetic thin film.

16. The method of claim 12, further comprising removing the ferromagnetic thin film after changing a property of the first thin film.

17. The method of claim 12, further comprising applying a diffusion barrier between the first thin film and the thin ferromagnetic film.

18. The method of claim 12, wherein at least one of the first and second acts of applying an oscillating magnetic field to the ferromagnetic thin film includes controllably energizing a coil positioned near the ferromagnetic thin film to generate a magnetic flux that induces a current in the ferromagnetic thin film to heat the ferromagnetic thin film.

19. The method of claim 18, wherein controllably energizing a coil comprises controlling the duration and frequency of a current provided to the coil.

20. The method of claim 12, wherein the act of applying an oscillating magnetic field includes using a resonant cavity.

* * * * *

UNITED STATES PATENT AND TRADEMARK OFFICE
CERTIFICATE OF CORRECTION

PATENT NO.        : 7,193,193 B2                                            Page 1 of 1
APPLICATION NO.   : 11/079618
DATED             : March 20, 2007
INVENTOR(S)       : Paul L. Bergstrom and Melissa L. Trombley It is certified that error appears in the above-identified patent and that said Letters Patent is hereby corrected as shown below:

On the title page Related U.S. Application Data should read:

(63) Continuation-in-part of application no. 10/376,497, filed February 28, 2003.

(60) Provisional application no. 60/360,667, filed March 1, 2002.

Signed and Sealed this

Twenty-second Day of May, 2007

JON W. DUDAS
*Director of the United States Patent and Trademark Office*